(12) United States Patent
Zhang et al.

(10) Patent No.: US 6,233,709 B1
(45) Date of Patent: May 15, 2001

(54) DYNAMIC ITERATIVE DECODING FOR BALANCING QUALITY OF SERVICE PARAMETERS

(75) Inventors: Vicki Ping Zhang, Coppell; Liangchi Hsu, Arlington, both of TX (US)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/206,909

(22) Filed: Dec. 7, 1998

(51) Int. Cl.$^7$ .......................... H03M 13/35; H03M 13/39
(52) U.S. Cl. ............................. 714/774; 714/794
(58) Field of Search .................................. 714/794, 795, 714/774

(56) References Cited

U.S. PATENT DOCUMENTS

| | | | |
|---|---|---|---|
| 5,563,897 | 10/1996 | Pyndiah et al. | 371/37.4 |
| 5,673,291 | * 9/1997 | Dent | 375/262 |
| 5,729,560 | 3/1998 | Hagenauer et al. | 371/43.1 |
| 5,734,962 | 3/1998 | Hladik et al. | 455/12.1 |
| 5,761,248 | 6/1998 | Hagenauer et al. | 375/340 |

OTHER PUBLICATIONS

Hong et al., "VLSI Design and Implementation of Low-Complexity Adaptive Turbo–Code Encoder and Decoder for Wireless Mobile Communication Applications", SIPS '98, Oct. 1998, pp. 233–242.*

Hong et al., "VLSI Circuit Complexity and Decoding Performance Analysis for Low–Power RSC Turbo–Code and Iterative Block Decoders Design", MILCOM 98, Oct. 1998, pp. 708–712.*

Mathew C. Valenti and Brian D. Woerner, "Variable Latency Turbo Codes for Wireless Multimedia Applications".

Claude Berrou, Alain Glavieux and Punya Thitimajshima, "Near Shannon Limit Error–Correcting Coding and Decoding: Turbo–Codes," (2/93).

* cited by examiner

Primary Examiner—Stephen M. Baker
(74) Attorney, Agent, or Firm—Brian T. Rivers

(57) ABSTRACT

A method and apparatus for iterative decoding of a coded information signal that allows quality of service, QoS, parameters to be dynamically balanced in a telecommunications system. In an embodiment, an iterative decoder performs decoding on a coded information signal based on minimum and maximum values for the number of decoding iterations to be performed for a particular data transmission. The minimum and maximum values for the number of decoding iterations are determined according to QoS requirements that are given in terms of BER and Tdelay.

8 Claims, 2 Drawing Sheets

DYNAMIC ITERATIVE DECODING FOR BALANCING QUALITY OF SERVICE PARAMETERS

FIELD OF THE INVENTION

This invention relates to decoding of a coded information signal in a telecommunications system and, more particularly, to a method and apparatus for iterative decoding of a coded information signal that allows quality of service parameters to be dynamically balanced in a telecommunications system.

BACKGROUND OF THE INVENTION

Multidimensional coding, or turbo coding, and associated iterative decoding methods have increasingly important application as data transmission services grow in sophistication. For example, next generation wireless communications systems currently under development are expected to support internet-based services, such as e-mail and web browsing. It has been proposed for at least some of these wireless communications systems to utilize turbo coding for the higher speed data transmission of the system.

A turbo decoder decodes an encoded signal by recursively processing frames of the encoded signal using more than one iteration through the decoder, as described, for example, by Berrou in "New Shannon Limit Error-correcting and Decoding: Turbo-codes (1)" Proceedings ICC 1993, pp. 1064–1070, and by Berrou and Glavieux in "Turbo-codes: General Principles and Applications," *Audio and Video Digital Radio Broadcasting Systems and Techniques*, 1993, pp. 215–226.

Several schemes have been presented in the literature for improving the performance of iterative decoders. U.S. Pat. No. 5,761,248, "Method and Arrangement for Determining an Adaptive Abort Criterion in Iterative Decoding of Multi-Dimensionally Coded Information," Hagenover, et al., discloses a method and apparatus for comparing a weighted decision on a soft output of a substep of iterative decoding to a weighted decision on a soft output and a combination of previous subsets of iterating and aborting the iterative decoding dependent on the comparison result. The publication, *Variable Latency Turbo Codes for Wireless Multimedia Applications*," by C. Valenti and D. Woerner, Proceedings of International Symposium on Turbo Codes and Related Topics, Brest, France, September 1997, pp. 216–219, disclosed the use of interleavers of variable sizes to achieve different quality of service, QoS, requirements.

Each of the above methods has its drawbacks. Using the first approach, there is no adaptive QoS consideration. With the second approach, using different interleavers for QoS may be difficult due to incompatibility with specifications of transmission frames per data rate. It also requires both the transmitter and receiver to change interleavers frequently, which is undesirable.

SUMMARY OF THE INVENTION

The present invention provides an iterative decoder that allows quality of service, QoS, parameters to be dynamically balanced. By dynamically adjusting the number of iterations, N, within an appropriate range, a coded information signal may be iteratively decoded so that at least one quality of service parameter remains within an acceptable performance range.

In an embodiment of the invention, the invention is implemented in an iterative decoder that performs iterative decoding on a coded information signal based on minimum, $N_{min}$, and maximum, $N_{max}$, values for the number of decoding iterations, N, to be performed for a particular data transmission, with $N_{min}$ and $N_{max}$ determined according to QoS requirements. QoS requirements for a particular data service may be expressed in terms of a maximum delay, Tdelay, and a maximum bit error rate (BER). The BER and maximum Tdelay may then be used to determine $N_{min}$ and $N_{max}$ for decoding the coded information signal. The determination of $N_{min}$ and $N_{max}$ may be made based on data tables stored in memory that include data on BER versus N and Tdelay versus N for a particular decoder configuration to be used in the iterative decoder.

In the embodiment, the iterative decoder receives the coded information signal in the form of data frames over a data transmission channel. For each data frame, $N_{min}$ iterations of decoding are performed. After $N_{min}$ iterations are performed, a convolutional redundancy code (CRC) check is performed on the decoded results of $N_{min}$ iterations. If the CRC check indicates that the data frame has been correctly decoded, the iterative decoder outputs the result and processes the next frame. If the CRC check indicates that the data frame has not been correctly decoded, the iterative decoder performs at least one other decoding iteration and CRC check. The decoding iterations are repeated until the CRC check indicates that the data frame has been correctly decoded or until the number of iterations is equal to $N_{max}$. If the number of iterations becomes equal to $N_{max}$, the data frame is considered in error and discarded and the decoding is begun on the next data frame. The iterative decoder may be configured to initiate transmission of a frame retransmit request to the transmitter if the data frame is discarded.

DETAILED DESCRIPTION OF THE INVENTION

Figure 1:
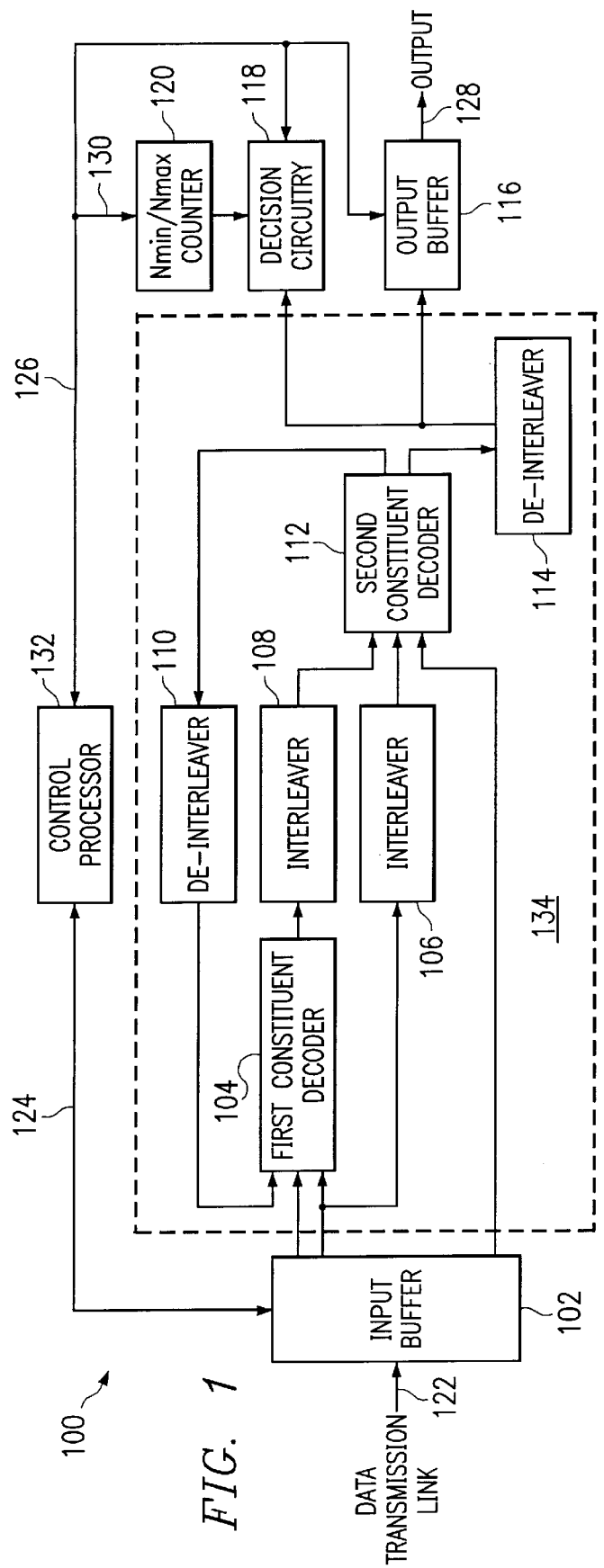
FIG. 1 is a functional schematic diagram of an iterative decoder according to an embodiment of the invention.

Iterative decoding according to the invention may be implemented into a receiver or a telecommunications system in which available system data services may each have different quality of service (QoS) requirements. The telecommunications system could be any type of data transmission system in which transmitted data is iteratively decoded. For example, a turbo decoder according an embodiment of the invention may be implemented into the receiver of a mobile station or base station of a cellular telecommunications system operating according to any one of a number of known standards or standards to be developed, such as the cdma2000 ITU-R RTT candidate submission Vol. 18/Jul. 27, 1998, published by the Telecommunications Industry Association (cdma2000) standard or the "Specification of Air-Interface for 3G Mobile System, Version 0.5," Jul. 21, 1998, Association of Radio Industries and Businesses (ARIB), Japan, which specify a turbo coding and decoding scheme for high-speed data transmission. The iterative decoder could also be implemented into other systems using wireless transmission, such as satellite systems, high definition television systems, or data transmission methods other than wireless, for example, landline or optical fibers. Referring now to FIG. 1, therein is a functional block diagram of an iterative decoder 100 according to an embodiment of the invention. Iterative decoder 100 comprises input buffer 102, output buffer 116, $N_{min}/N_{max}$ counter 120, decision circuitry 118, control processor 132, and decoder circuitry 134. Decoder circuitry 134 comprises first constituent decoder 104, interleaver 106, interleaver 108, second constituent decoder 112, de-interleaver 114, and de-interleaver 110.

Iterative decoder 100 provides iterative decoding of a coded information signal that may be dynamically adjusted to balance quality of service (QoS) requirements for a particular data service. Iterative decoder 100 may decode a coded information signal that is encoded according to any type of iterative coding scheme, such as, for example, recursive convolutional systematic turbo coding. The interleaver size and code rate of the particular code may be of any value acceptable to provide data rates within the range of acceptable values for a particular data service. Iterative decoder 100 is then controlled, according to the invention, to allow QoS parameters to be dynamically adjusted within the range of acceptable values for the particular data service to provide enhanced performance.

QoS requirements for a particular data transmission service may be expressed in terms of a maximum delay, Tdelay, and a maximum bit error rate (BER). In the embodiment of the invention, Tdelay and BER are both taken into consideration when dynamically determining upper and/or lower limits for the number of iterations of turbo decoding, N, to be performed in the decoding of a received data frame. The determination of upper and/or lower limits for N, using both Tdelay and BER, allows turbo coding of a data frame to be performed in a manner that balances the effects of the QoS requirements on the decoding. By choosing an $N_{max}$ and $N_{min}$ based on Tdelay and BER, respectively, the chances of decoding a data frame in a manner that meets both of these requirements are increased. Additionally, actual delay may be reduced as much as possible. If BER requirements can be met with a minimum number of decoder iterations on a good data transmission link, the delay will be minimal for that BER. This maximizes the quality of the data service.

Figure 2:
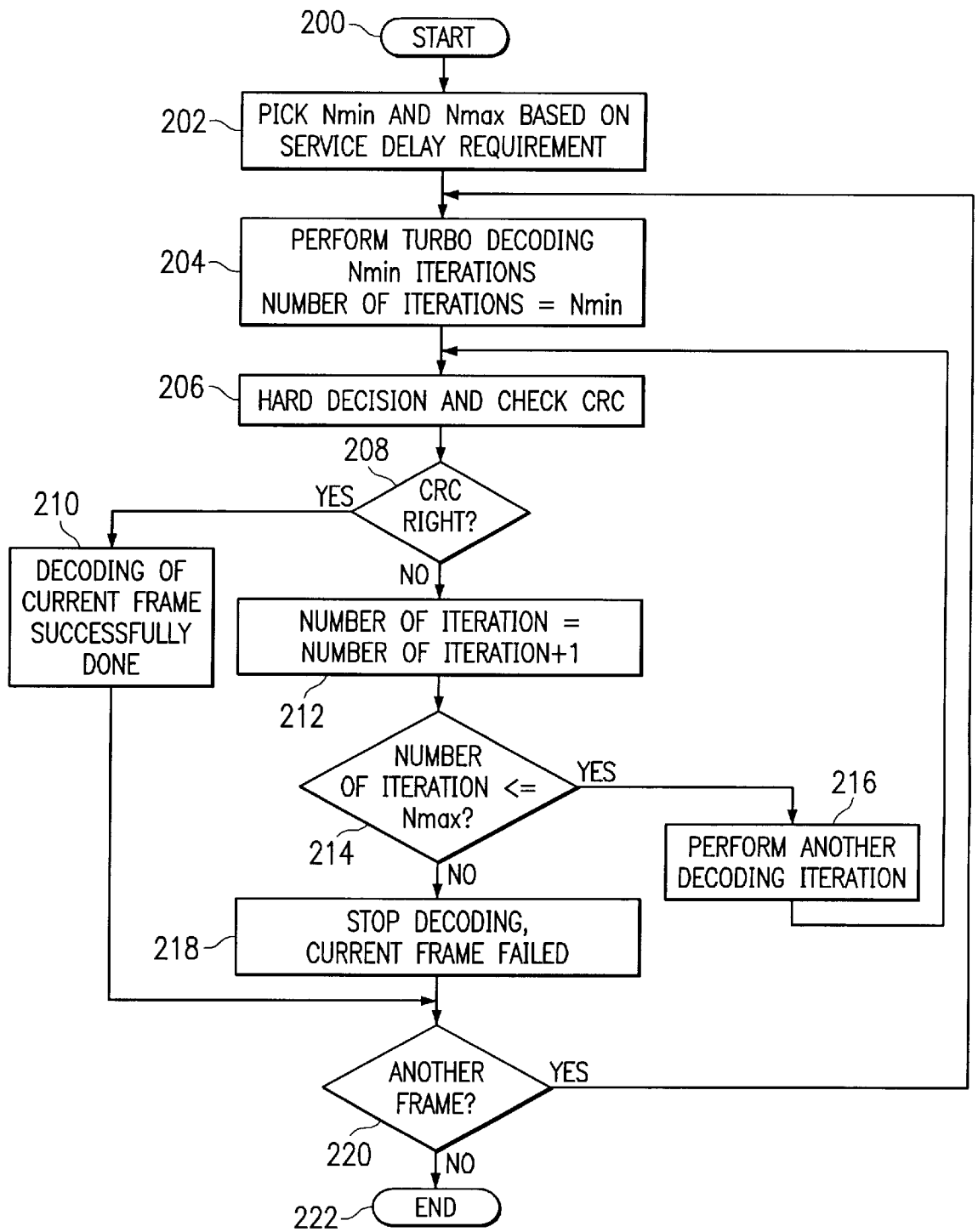
FIG. 2 is a flow diagram illustrating process steps performed according to an embodiment of the invention.

Referring now to FIG. 2, therein is a flow diagram showing process steps performed by iterative decoder 100 according to the embodiment of the invention. The process of FIG. 2 begins at step 200 when one or more data frames are received to be decoded in iterative decoder 100. Next, at step 202, control processor 132 determines a value for a minimum number of iterations, $N_{min}$, and a maximum number of iterations, $N_{max}$, to be performed in the turbo decoding on each data frame. $N_{min}$ and $N_{max}$ may be determined from QoS information that is transmitted to control processor 132 at the setup or initialization of the transmission link. In the embodiment of FIG. 1, the QoS information in the form of a bit error rate (BER) and maximum delay, Tdelay, allowed for the turbo decoder processing is received at data transmission link 122 and transferred to control processor 132 through buffer 102. Control processor 132 may then determine $N_{min}$ and $N_{max}$ from look-up tables stored in a memory in control processor 132. The look-up tables may be created from data for values of BER and Tdelay over the data link versus number of iterative decoder iterations, N, in average channel conditions for a particular turbo-decoding configuration.

Figure 3B:
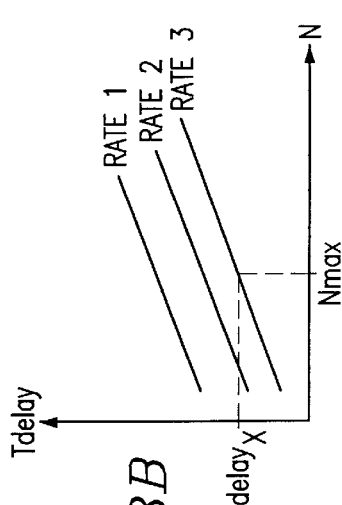
FIGS. 3A and 3B are a representative bit error rate versus number of decoder iterations plot, and a decoding delay versus number of decoder iterations plot, respectively, according to an embodiment of the invention.
Figure 3A:
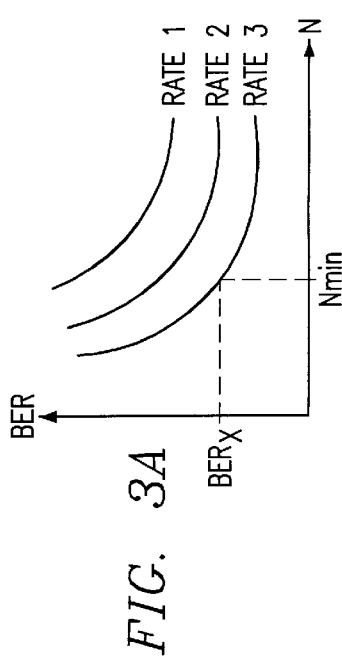

Referring now to FIG. 3A and FIG. 3B, therein are illustrated plots representing BER and Tdelay, respectively, versus number of turbo decoder iterations, N, for a particular turbo-decoding configuration. In systems in which it is possible to provide data channels of varying rates or interference quality, the system may dynamically determine the QoS requirements based on the particular configuration of data channels used to transmit the information. For example, for a higher speed transmission link, the system Tdelay requirements for the iterative decoder may be less stringent, allowing a higher Tdelay. Data representing a plurality of pairs of curves, such as those illustrated in FIG. 3A and FIG. 3B, may be stored within control processor 132. Each pair of curves may represent the BER and Tdelay characteristic for a particular iterative decoding configuration that may be used in iterative decoder 100. Control processor 132 may then use the information identifying the particular iterative coding scheme being used to choose the appropriate pair of curves.

Given a BER of $BER_x$, based on a particular transmission rate, $N_{min}$ is chosen from data stored in memory of control processor 132. This is illustrated in FIG. 3A. $Tdelay_x$ is then used to choose $N_{max}$ from the data stored in memory of control processor as illustrated in FIG. 3B. If $N_{min}$ is greater than $N_{max}$, the value of $N_{min}$ will be used for $N_{max}$, and $N_{min}$ will be set to zero.

Next, at step 204, a data frame received on the link is input on data transmission link 122 to input buffer 102 and processed in decoder circuitry 134 for $N_{min}$ iterations. Processing for $N_{min}$ iterations before any decision is made reduces unnecessary processing that would otherwise be done when the chances of meeting the BER requirements were low. Control processor 132 generates appropriate control signals on data line 124 to input buffer 102 and data line 130 to $N_{min}/N_{max}$ counter 120, so that each data frame is processed through the correct number of decoding iterations according to the embodiment of the invention. Next, at step 206, a hard decision is made in decision circuitry 118 on the decoding output of de-interleaver 114 after $N_{min}$ decoding iterations. Decision circuitry 118 determines whether a CRC check for the current data frame indicates a CRC error and generates a decision result signal to control processor 132. Next, at step 208, control processor 132 determines if there is a CRC error. If it is determined at step 208 that there is no CRC error, the process moves to step 210, where control processor 132 generates a control signal to output buffer 116 causing output buffer 116 to output the decoded data frame. Next, at step 220, control processor 132 determines if another frame exists in input buffer 102 for processing. If it is determined that another frame does not exist, the process moves to step 222 and ends. If, however, at step 220 it is determined that another frame exists for processing in input buffer 102, the process moves to step 204. At step 204, the next data frame is input from input buffer 102 to first constituent decoder 104 and interleaver 106. The process then begins again for the next data frame.

If, however, at step 208, it is determined that the CRC check indicates a CRC error, the process moves to step 212. At step 212, a field indicating the total number of iterations for the current data frame being decoded is incremented by one. The process then moves to step 214. At step 214, control processor 132 determines if the total number of iterations is less than or equal to $N_{max}$. If the number of iterations is not less than or equal to $N_{max}$, the process moves to step 218. At step 218, control processor 132 generates control signals to cause output buffer 116 to discard the current frame. Control processor 132 may also generate signals to an associated transmitter (not shown) that would initiate a retransmission request in the reverse direction over data transmission link 122 for a discarded frame. Next, at step 220, control processor 132 determines if another frame exists in input buffer 102 for processing. If it is determined that another frame does not exist, the process moves to step 222 and ends. If, however, at step 220 it is determined that another frame exists for processing in input buffer 102, the process moves to step 204. At step 204, the next data frame is input from input buffer 102 to first constituent decoder 104 and interleaver 106. The process then begins again for the next data frame.

While the invention has been described in the context of particular embodiments, various other embodiments and variations of these particular embodiments may be realized. For example, the processing to determine the values of $N_{min}$ and $N_{max}$ from QoS requirements may be performed completely by processors on the transmitting side of the data transmission link, and $N_{min}$ and $N_{max}$ may be transmitted to iterative decoder 100 directly. The various steps of the processing could also be allocated between the transmitting side of the data transmission link and turbo decoder 100 in other ways depending on the system resources and desired allocation of processing tasks. Thus, although the method and apparatus of the present invention has been illustrated and described with respect to presently preferred embodiments thereof, it will be understood that numerous modifications and substitutions may be made to the embodiments described and that numerous other embodiments of the invention may be implemented without departing from the spirit and scope of the invention as defined in the following claims.

What is claimed is:

1. A method of iteratively decoding a coded information signal, said method comprising the steps of:
   determining a minimum and maximum number of iterations of iterative decoding to be performed on the information signal, said minimum number of iterations determined from a bit error rate value and said maximum number of iterations determined from a time delay value;
   performing N iterations of iterative decoding on the coded information signal, wherein N is a number at least equal to said minimum number of iterations;
   determining if a result of said N iterations meets predetermined error criteria; and
   in response to a negative determination in said step of determining:
      repetitively performing at least one other iteration of iterative decoding on the coded information signal and determining if a result of said at least one other iteration meets said predetermined error criteria, until it is determined that said result of said at least one other iteration meets said predetermined error criteria, or until the total number of iterations performed on the information signal is equal to said the maximum number of iterations.

2. The method of claim 1, wherein said coded information signal comprises a data frame.

3. The method of claim 1, wherein said step of determining if a result of said N iterations meets predetermined error criteria comprises performing a cyclic redundancy check on said result of said N iterations.

4. A method of iteratively decoding a coded information signal, said method comprising the steps of:
   determining a minimum number of iterations of iterative decoding to be performed on the information signal, wherein said minimum number of iterations is determined from a bit error rate;
   performing N iterations of iterative decoding on the coded information signal, wherein N is a number at least equal to said minimum number of iterations;
   determining if a result of said N iterations meets predetermined error criteria; and
   in response to a negative determination in said step of determining:
      repetitively performing at least one other iteration of iterative decoding on the coded information signal and determining if a result of said at least one other iteration meets said predetermined error criteria, until it is determined that said result of said at least one other iteration meets said predetermined error criteria.

5. An apparatus for iteratively decoding a coded information signal, said apparatus comprising:
   decoder circuitry for performing iterative decoding on the coded information signal and generating a decoding result;
   decision circuitry for determining if said decoding result meets a predetermined error criteria and generating a decision result; and
   a control processor coupled to said decoder circuitry and said decision circuitry, wherein said control processor determines a minimum and maximum number of iterations of iterative decoding to be performed on the information signal, wherein said minimum number of iterations is determined from a bit error rate value and said maximum number of iterations is determined from a time delay value said control processor further for directing said decoder circuitry to perform N iterations of iterative decoding on the coded information signal, wherein N is a number at least equal to said minimum number of iterations, determining if said decision result generated in said decision circuitry indicates that said decoding result for said N iterations does not meet a predetermined criteria, and, in response to said determination, said control processor further for directing said decoder circuitry repetitively to perform at least one other iteration of iterative decoding on the coded information signal, until said decision result indicates a decoding result of said at least one other iteration that meets said predetermined error criteria or until said control processor further directs said decoder circuitry to abort performance of said at least one other iteration of iterative decoding based on determine that the total number of iterations performed on the information signal is equal to said maximum number of iterations.

6. The apparatus of claim 5, wherein said coded information signal comprises a date frame.

7. The apparatus of claim 5, wherein said decision circuitry determines if said decoding result meets predetermined error criteria by performing a convolutional redundancy check.

8. An apparatus for iteratively decoding a coded information signal, said apparatus comprising:
   decoder circuitry for performing iterative decoding on the coded information signal and generating a decoding result;
   decision circuitry for determining if said decoding result meets a predetermined error criteria and generating a decision result; and
   a control processor coupled to said decoder circuitry and said decision circuitry, wherein said control processor determines a minimum number of iterations of iterative decoding to be performed on the information signal, wherein said minimum number of iterations is determined from a bit error rate value, said control processor further for directing said decoder circuitry to perform N iterations of iterative decoding on the coded information signal, wherein N is a number at least equal to said minimum number of iterations, determining if said decision result generated in said decision circuitry indicates that said decoding result for such N iterations does not meet a predetermined criteria, and, in response to said determination, said control processor further for directing said decoder circuitry repetitively to perform at least one other iteration of iterative decoding on the coded information signal, until said decision result indicates a decoding result of said at least one other iteration that meets said predetermined error criteria.

* * * * *

UNITED STATES PATENT AND TRADEMARK OFFICE
CERTIFICATE OF CORRECTION

PATENT NO. : 6,233,709 B1
DATED : May 15, 2001
INVENTOR(S) : Vicki Ping Zhang and Liangchi Hsu Page 1 of 1

It is certified that error appears in the above-identified patent and that said Letters Patent is hereby corrected as shown below:

Column 5, claim 1,
Line 34, preceeding "information", insert -- coded --;
Line 51, preceeding "information", insert -- coded --;

Column 5, claim 4,
Line 63, preceeding "information", insert -- coded --;

Column 6, claim 5,
Line 24, preceeding "information", insert -- coded --;
Line 44, preceeding "information", insert -- coded --;

Column 6, claim 8,
Line 64, preceeding "information", insert -- coded --;

Signed and Sealed this

Sixteenth Day of April, 2002

Attest:

Attesting Officer

JAMES E. ROGAN
Director of the United States Patent and Trademark Office